United States Patent
Han et al.

(10) Patent No.: US 9,368,361 B2
(45) Date of Patent: Jun. 14, 2016

(54) METHOD OF MAKING A SEMICONDUCTOR DEVICE

(71) Applicant: Amkor Technology, Inc., Chandler, AZ (US)

(72) Inventors: Seung Chul Han, Gyeonggi-do (KR); Jae Kyu Song, Gyeonggi-do (KR); Do Hyung Kim, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/901,837

(22) Filed: May 24, 2013

(65) Prior Publication Data

US 2013/0330931 A1 Dec. 12, 2013

(30) Foreign Application Priority Data

Jun. 11, 2012 (KR) .................. 10-2012-0062294

(51) Int. Cl.
*H01L 21/00* (2006.01)
*H01L 21/304* (2006.01)
*H01L 21/683* (2006.01)

(52) U.S. Cl.
CPC .......... *H01L 21/304* (2013.01); *H01L 21/6835* (2013.01); *H01L 21/6836* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC .............. H01L 21/304; H01L 21/6835; H01L 21/6836; H01L 2221/68318; H01L 2221/68327; H01L 2221/6834; H01L 2221/68381
See application file for complete search history.

(56) References Cited

U.S. PATENT DOCUMENTS

| | | | | |
|---|---|---|---|---|
| 5,672,549 A | * | 9/1997 | Minami ................ | B29C 45/00 257/E21.504 |
| 6,478,918 B2 | * | 11/2002 | Bennett et al. ................ | 156/248 |
| 2012/0273975 A1 | * | 11/2012 | Hayashishita et al. ........ | 257/790 |

FOREIGN PATENT DOCUMENTS

| | | |
|---|---|---|
| KR | 10-0517075 A | 9/2005 |
| KR | 10-0792950 A | 1/2008 |
| KR | 10-0884192 A | 2/2009 |

OTHER PUBLICATIONS

Office Action received from Korean Patent Office in Korean; English Translation Not Available; Date: Jun. 13, 2013; 4 pages.

* cited by examiner

*Primary Examiner* — Richard Booth
(74) *Attorney, Agent, or Firm* — Kevin B. Jackson

(57) ABSTRACT

In one embodiment, a method for forming an electronic device includes providing a substrate having a plurality of electronic devices formed therein, forming a protective layer over a major surface of the substrate containing the plurality of electronic devices, forming a mold layer over the protective layer, thinning a major surface of the substrate opposite to the major surface containing the plurality of electronic devices, and removing the adhesive layer and the mold layer. In another embodiment, a zone coating layer can be included between the protective layer and the mold layer.

20 Claims, 9 Drawing Sheets

METHOD OF MAKING A SEMICONDUCTOR DEVICE

CROSS REFERENCE TO RELATED APPLICATIONS

This application claims priority to Korean Patent Application No. 10-2012-0062294 filed on Jun. 11, 2012, which is expressly incorporated by reference herein.

BACKGROUND

The present invention relates to methods for fabricating electronic devices and, more specifically, to methods for fabricating semiconductor devices.

In the course of fabricating semiconductor devices, the substrates or wafers in which the devices are made are often thinned so that the devices can meet size and performance requirements. Wafer thinning techniques, such as wafer grinding, are used to remove portions of the wafers on a side that is typically opposite to the side where the electronic circuitry is formed. The wafer surface where the thinning step is applied is often termed the "backside" of the wafer.

The wafer thinning step usually takes place towards the end of the wafer fabrication process, for example, either before a back metal step or a wafer singulation step. Prior to wafer thinning, wafers typically have a thickness of about 600 microns to about 750 microns. After the thinning step, the wafers can have a thickness of less than about 75 microns.

In a typical wafer grinding process, a protective material is placed over the front side of the wafer to protect the electronic circuitry formed thereon. The wafer is then secured to a vacuum chuck, and a rotating work chuck, which typically includes a rotating diamond cup wheel, sweeps across the wafer to remove material from the backside thereof. One problem with current wafer thinning processes is that thickness variation in the protective material can affect the final thickness uniformity or flatness of the wafer after grinding. This thickness variation can affect the reliability of the final individual semiconductor devices, resulting in increased failures.

Accordingly, it is desirable to have methods for fabricating electronic devices that improve the final thickness uniformity of thinned wafers and the individual electronic devices that are formed therein.

For simplicity and clarity of the illustration, elements in the figures are not necessarily drawn to scale, and the same reference numbers in different figures denote the same elements. Additionally, descriptions and details of well-known steps and elements are omitted for simplicity of the description.

DETAILED DESCRIPTION OF THE DRAWINGS

Figure 1:
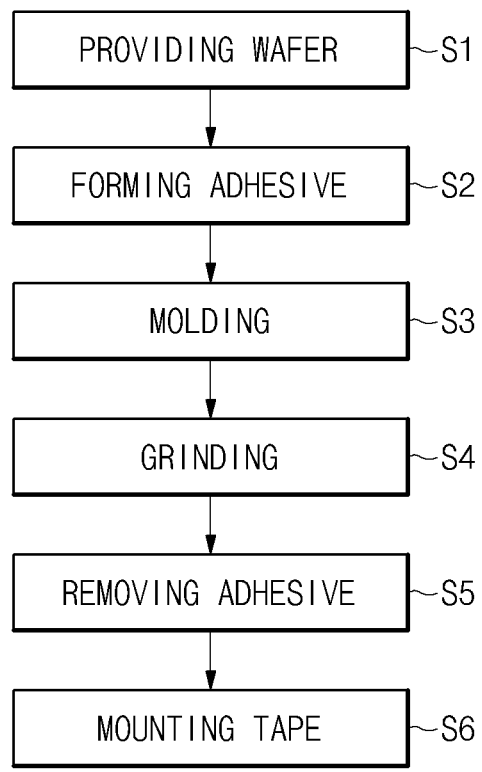
FIG. 1 is a flowchart illustrating a fabricating method of a semiconductor device according to a first embodiment of the present invention.

FIG. 1 is a flowchart illustrating a fabricating method for forming an electronic device, such as a semiconductor device, in accordance with a first embodiment. In one embodiment, the method of FIG. 1 can be used as part of a wafer or substrate thinning process during the fabrication of semiconductor devices. FIGS. 2 to 7 illustrate cross-sectional views of a wafer or substrate containing semiconductor devices at various steps of manufacture in accordance with the method of FIG. 1. Referring to FIG. 1, the method can include the steps of providing a wafer (S1), forming an adhesive layer on a surface of the wafer (S2), molding or encapsulating the adhesive layer to form a mold layer (S3), grinding the backside of the wafer (S4), removing the adhesive layer from the wafer (S5), and tape mounting the wafer (S6) for further processing. These respective steps of FIG. 1 will now be described with reference to FIGS. 2 to 7.

Figure 2:
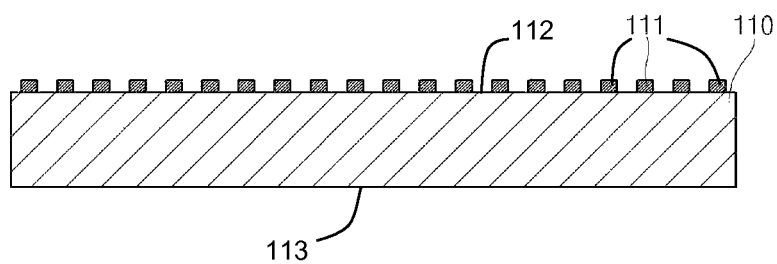
FIGS. 2 to 7 illustrate cross-sectional views of a wafer containing semiconductor devices at various steps of manufacture in accordance with the fabricating method of FIG. 1.

Referring to FIGS. 1 and 2, in the step of providing the wafer (S1), a substrate or wafer 110 having opposed major surfaces 112 and 113 can be provided. In one embodiment, wafer 110 can be a semiconductor substrate, such as silicon, a IV-IV semiconductor material, or a III-V semiconductor material. In other embodiments, wafer 110 can be a semiconductor-on-insulator material, a ceramic, or other materials requiring a thinning step. In one embodiment, wafer 110 contains a plurality of semiconductor devices. In the present embodiment, major surface 112 corresponds to one surface of wafer 110 where electrical circuitry and devices (not shown) can be formed, and major surface 113 corresponds to the backside surface of wafer 110. In one embodiment, conductive structures 111, such as bonding pads, bumps, or solder balls, can be formed on one surface or major surface 112 of wafer 110. Conductive structures 111 can be patterned, plated, or soldered metal structures configured for carrying electric signals into and out of the electrical circuitry formed within or on the individual semiconductor devices within wafer 110. Although not shown, a through-electrode or through-wafer-via connected to conductive structures 111 and passing through wafer 110 along its thickness can also be included to provide a conductive path between major surfaces 112 and 113.

Figure 3:
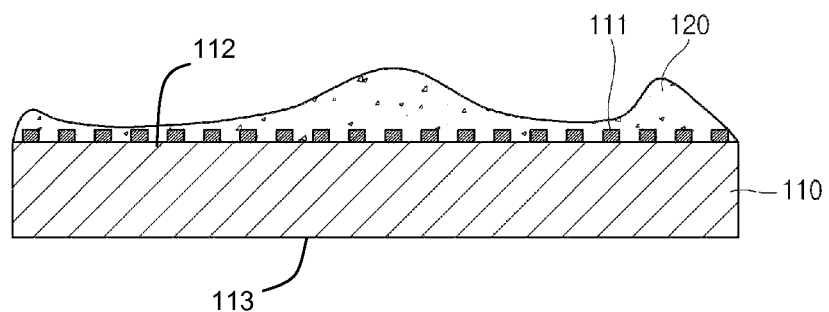

Referring to FIGS. 1 and 3, in the step of forming the adhesive layer (S2), a protective layer, such as an adhesive layer 120, can be coated on major surface 112 of wafer 110. In the present embodiment, adhesive layer 120 can be formed overlying and surrounding conductive structures 111. In one embodiment, adhesive layer 120 can be spin-coated onto major surface 112. In one embodiment, adhesive layer 120 can be a multi-component adhesive, such as a general epoxy-based resin; however, aspects of the present embodiment are not limited thereto. Ideally, adhesive layer 120 should be formed to have a uniform or substantially uniform thickness across major surface 112 of wafer 110. However, practically, and as generally illustrated in FIG. 3, the thickness of adhesive layer 120 across major surface 112 can have a thickness variation or deviation, which is undesirable. In addition, because the completed semiconductor devices within wafer 110 can be very thin (for example, less than 75 microns), the thickness deviation of the adhesive layer 120 may translate to the final thickness of the individual semiconductor devices, thereby affecting the reliability of the completed semiconductor devices. In order to reduce the effects of the thickness variation of adhesive layer 120, the following method can be used with wafer 110 in accordance with the first embodiment.

Figure 4:
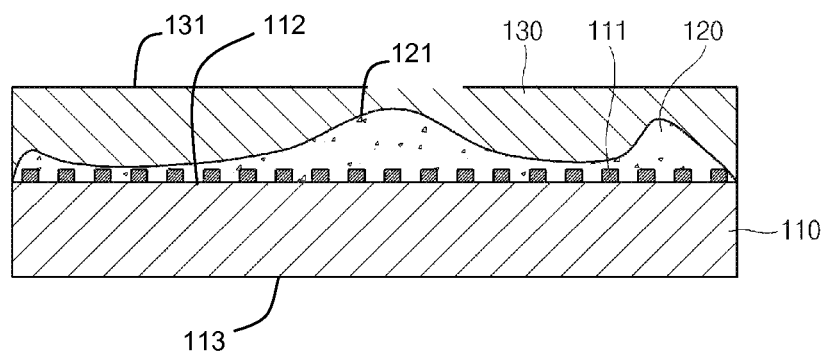

Referring to FIGS. 1 and 4, in the step of molding (S3), an outer or exposed surface 121 of adhesive layer 120 is molded with an encapsulant material to form a mold layer 130 thereon. In one embodiment, mold layer 130 can be an epoxy resin molding compound and can be formed using injection or overmolding techniques. In accordance with the present embodiment, mold layer 130 is configured to correct or reduce the thickness variation or deviation of adhesive layer 120. In one embodiment, mold layer 130 can be formed to have a thickness greater than the thickness or thickest portion of adhesive layer 120, thereby offsetting the thickness deviation of adhesive layer 120, as generally illustrated in FIG. 4. In accordance with the present embodiment, the outer or exposed surface 131 of molding layer 130 (that is, the surface opposite to the surface contacting adhesive layer 120) is formed or molded to be substantially flat. In one embodiment, this can be achieved using a tight-tolerance molding apparatus formed using precision machining techniques. Therefore, mold layer 130 can offset the thickness deviation of adhesive layer 120. As one result, failures that may be generated at the time of fabricating the semiconductor device can be reduced using the molding step (S3) of the present embodiment, thereby increasing the yield and improving product reliability.

Figure 5:
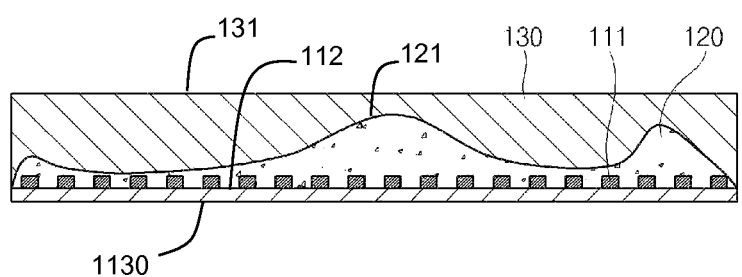

Referring to FIGS. 1 and 5, in the step of grinding the backside of wafer 110 (S4), major surface 113 of wafer 110 is exposed to a grinding or lapping process to reduce the thickness of wafer 110. The grinding step forms a new backside surface 1130 on wafer 110, as generally illustrated in FIG. 5. Adhesive layer 120 and mold layer 130 protect major surface 112 of wafer 110, including conductive structures 111 from damage during the step of grinding (S4).

Figure 6:
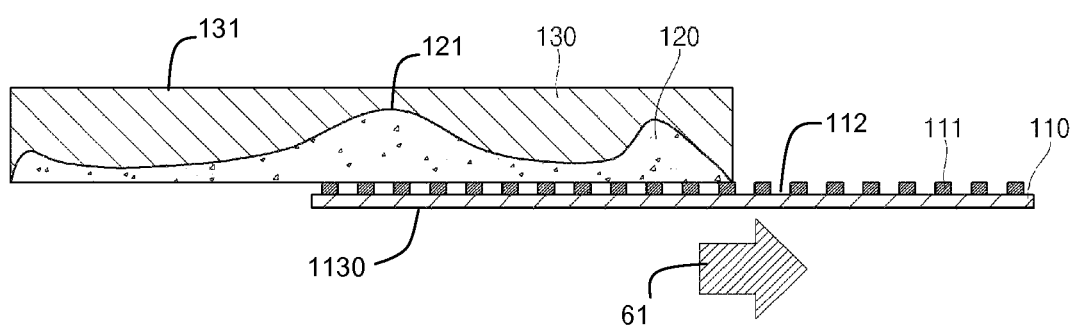

Referring to FIGS. 1 and 6, in the step of removing adhesive layer 120 (S5), adhesive layer 120 and mold layer 130 are removed from major surface 112 of wafer 110. In one embodiment, adhesive layer 120 and mold layer 130 can be removed by applying heat to the interface between wafer 110 and adhesive layer 120, and then sliding wafer 110 away from adhesive layer 120, as generally represented by arrow 61. After the removing of adhesive layer 120 from wafer 110, the fabricating method of the semiconductor device may further include rinsing major surface 112 of wafer 110, using, for example, a spin, rinse, and dry apparatus.

Figure 7:
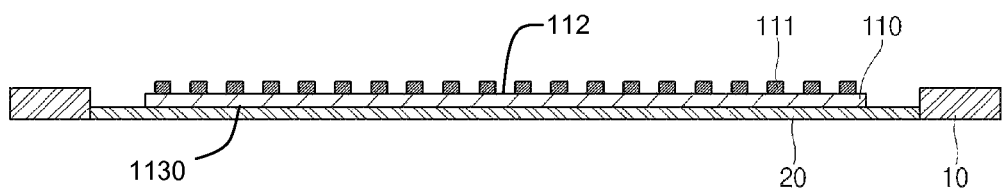

Referring to FIGS. 1 and 7, in the step of tape mounting (S6) wafer 110, wafer 110 can be mounted onto a tape 20 having opposite sides or outer edges fixed to, for example, a rigid frame 10. The wafer 110 can then be separated into individual semiconductor dies through a subsequent singulation step. In addition, tape 20 may reduce the impact of stresses applied to the wafer 110 during the singulation step. After the singulation step, the individual semiconductor devices can be removed using, for example, a pick-and-place apparatus and can be assembled into protective package structures (not shown).

In the fabricating method of the semiconductor device according to the first embodiment described herein, the yield and reliability of semiconductor devices within wafer 110 can be improved by forming adhesive layer 120 on major surface 112 of wafer 110 having conductive structures 111, and then forming mold layer 130 on adhesive layer 120 to correct or compensate for the thickness variation or deviation of adhesive layer 120.

Figure 8:
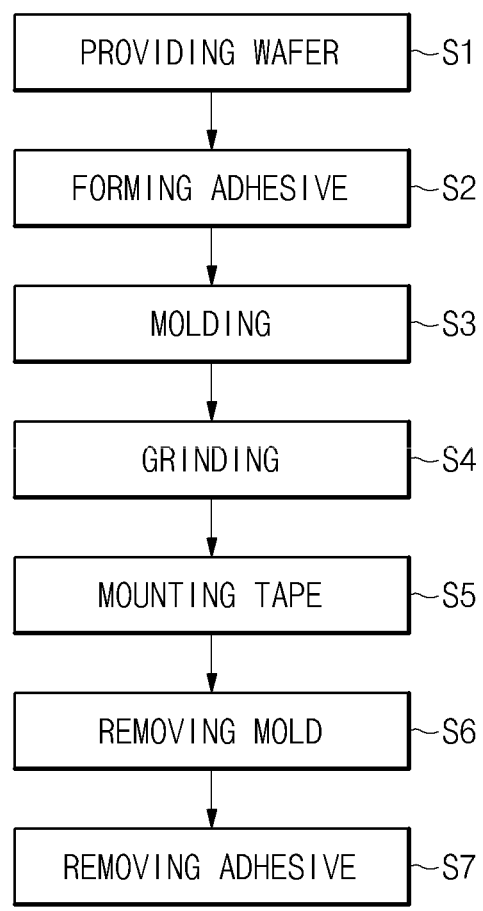
FIG. 8 is a flowchart illustrating a fabricating method of a semiconductor device according to a second embodiment of the present invention.
Figure 9:
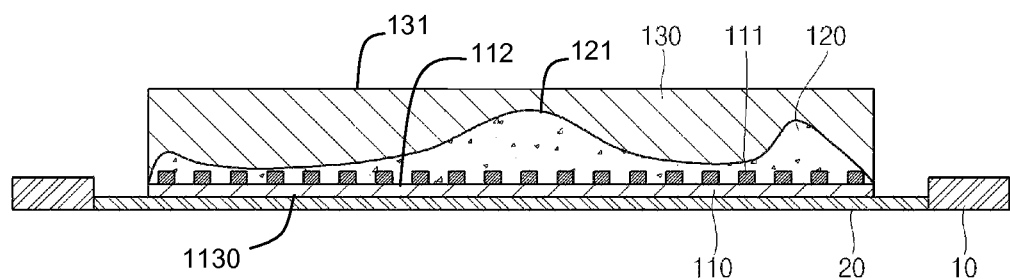
FIGS. 9 to 11 illustrate cross-sectional views of a wafer containing semiconductor devices at various steps of manufacture in accordance with the fabricating method of FIG. 8.
Figure 10:
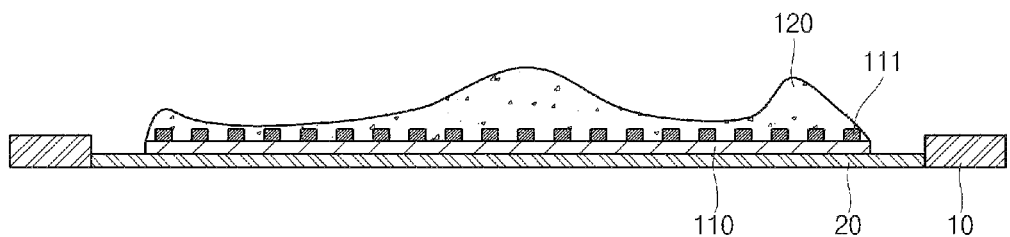
Figure 11:
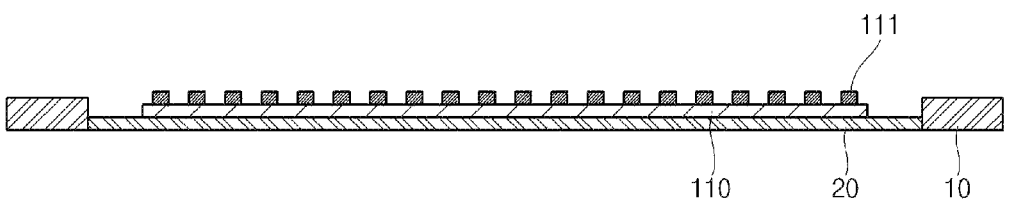

FIG. 8 is a flowchart illustrating a fabricating method for forming an electronic device, such as a semiconductor device, in accordance with a second embodiment. In one embodiment, the method of FIG. 8 can be used as part of a wafer or substrate thinning process during the fabrication of semiconductor devices. FIGS. 9 to 11 illustrate cross-sectional views of a wafer or substrate including semiconductor devices at various steps of manufacture in accordance with the method of FIG. 8.

Referring to FIG. 8, the method can include the steps of providing a wafer (S1), forming an adhesive layer (S2), molding or encapsulating the adhesive layer to form a mold layer (S3), grinding the backside of the wafer (S4), mounting the wafer to a tape (S5), removing the mold layer (S6), and removing the adhesive layer (S7). The respective process steps of FIG. 8 will now be described with reference to FIGS. 9 to 11. Detailed descriptions of process steps that are the same as those of the first embodiment will not be repeated, and the following description will focus on differences between the first and second embodiments. In one embodiment, the steps of providing the wafer (S1), forming the adhesive layer (S2), forming the mold layer (S3), and grinding the backside of the wafer (S4) are the same as those of the first embodiment.

Referring to FIGS. 8 and 9, after the grinding step, wafer 110 can be mounted to tape 20, which has opposite sides or outer edges fixed to a rigid frame 10. In the present embodiment, surface 1130 of wafer 110 can be mounted to an upper surface of tape 20. Specifically, tape 20 is adhered to the bottom surface of wafer 110 opposite to a top surface of wafer 10, which has mold layer 130 formed thereon. Accordingly, because major surface 1130 of wafer 110 is fixed to tape 20, wafer 110 can be securely supported for subsequent processing.

Referring to FIGS. 8 and 10, in the step of removing the mold layer (S6), mold layer 130 is removed from wafer 110. In one embodiment, mold layer 130 can be removed by applying an external force to mold layer 130 to physically remove mold layer 130 from wafer 110 while wafer 110 is fixed to tape 20. In accordance with the present embodiment, adhesive layer 120 functions as a buffer layer to prevent wafer 110 from being damaged when mold layer 130 is removed. In addition, because major surface 1130 of wafer 110 is fixed to tape 20, damage to wafer 110 can be reduced or minimized while removing mold layer 130.

Referring to FIGS. 8 and 11, in the step of removing the adhesive layer (S7), adhesive layer 120, which remains on major surface 112 of wafer 110, can be removed using, for example, a spin-rinse water process at room temperature. In another embodiment, adhesive layer 120 can be removed by applying heat thereto. In a further embodiment, adhesive layer 120 can be removed using a solvent. Once adhesive layer 120 is removed, wafer 110 may go through subsequent process steps, including, for example, singulation and packaging. In another embodiment, a back metal layer can be formed on major surface 1130 before the step of singulation.

Figure 12:
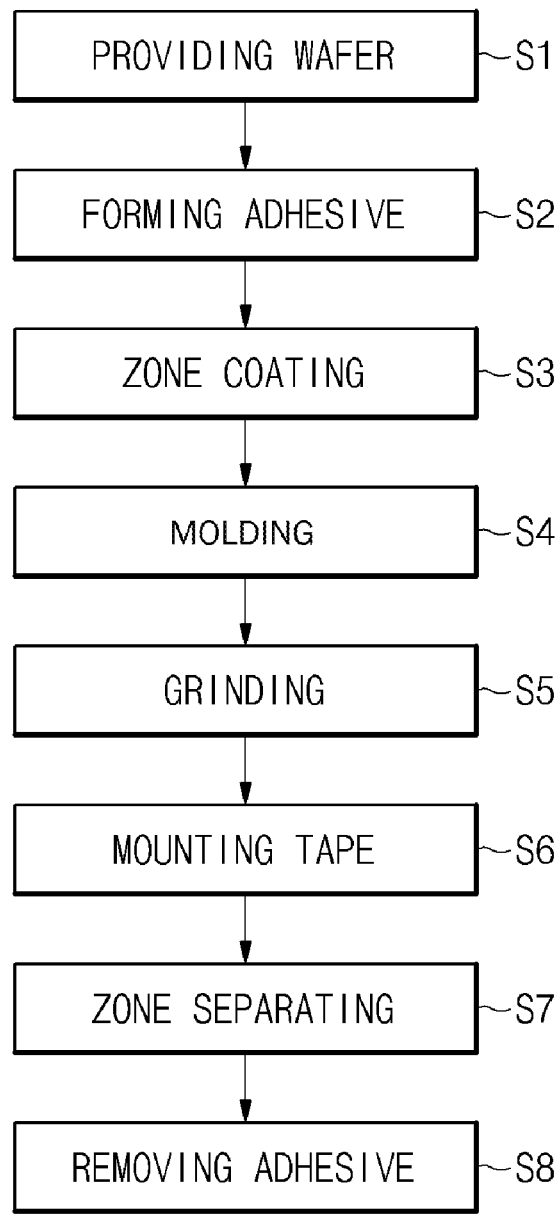
FIG. 12 is a flowchart illustrating a fabricating method of a semiconductor device according to a third embodiment of the present invention.
Figure 13:
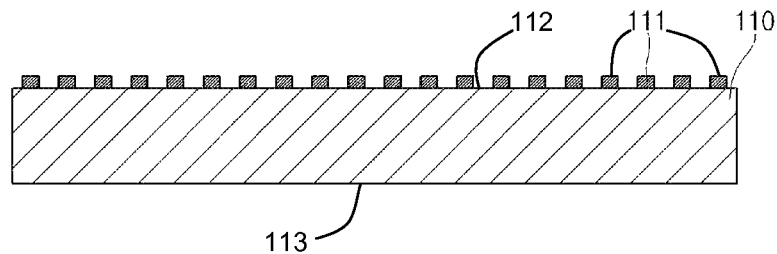
FIGS. 13 to 20 illustrate cross-sectional views of a wafer containing semiconductor devices at various steps of manufacture in accordance with the fabricating method of FIG. 12.
Figure 14:
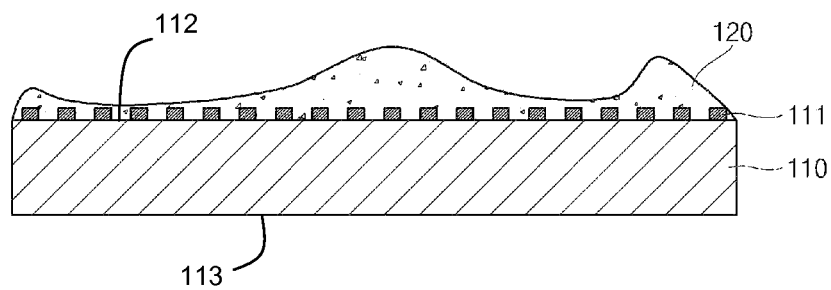

FIG. 12 is a flowchart illustrating a fabricating method for forming an electronic device, such as a semiconductor device, in accordance with a third embodiment. In one embodiment, the method of FIG. 12 can be used as part of a wafer or substrate thinning process during the fabrication of semiconductor devices. FIGS. 13 to 20 illustrate cross-sectional views of a wafer or substrate including semiconductor devices at various steps of manufacture in accordance with the method of FIG. 12.

Referring to FIG. 12, the method can include providing a wafer (S1), forming an adhesive layer (S2), performing zone coating (S3), molding or encapsulating the adhesive layer to form a mold layer (S4), grinding the backside of the wafer (S5), mounting the wafer to a tape (S6), performing zone separating (S7), and removing the adhesive layer (S8). The respective process steps of FIG. 12 will now be described with reference to FIGS. 13 to 20. Detailed descriptions of process steps that are the same as those of the first embodiment will not be repeated, and the following description will focus on differences between the first and third embodiments. Specifically, and with reference to FIGS. 12, 13, and 14, the steps of providing the wafer (for example, wafer 110) (S1) and forming the adhesive layer (for example, adhesive layer 120) (S2) can be the same as those of the first embodiment.

Figure 15:
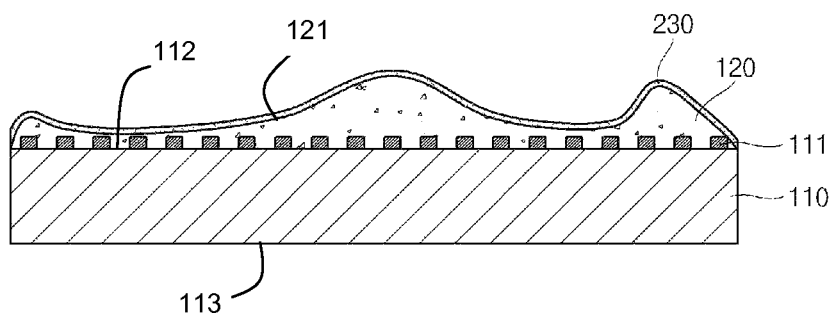

Referring to FIGS. 12 and 15, in the step of performing of the zone coating (S3), a coating layer 230 can be formed on or attached to an outer or exposed surface 121 of adhesive layer 120. In one embodiment, coating layer 230 can be formed along or cover the entire surface of adhesive layer 120. In another embodiment, only portions of adhesive layer 120 are zone coated.

In accordance with the present embodiment, coating layer 230 can be formed between adhesive layer 120 and a mold layer 240, which is to be formed in a subsequent step, and coating layer 230 can be provided to increase the coupling force between mold layer 240 and adhesive layer 120. In one embodiment, coating layer 230 can be a zone coating carrier configuration and can be pressed onto adhesive layer 120 to form a temporary bond. In one embodiment, coating layer 230 can be a polymer material, such as polyester or polypropylene materials. Alternatively, coating layer 230 can be an epoxy material. In one embodiment, coating layer 230 can be configured to have a central zone and an edge zone, with the central zone configured to have less adhesive than that of the edge zone. In one embodiment, a ZoneBOND® brand thin wafer carrier layer, available from Brewer Scientific, Inc. of Rolla, Mo., U.S.A., can be used for coating layer 230.

Figure 16:
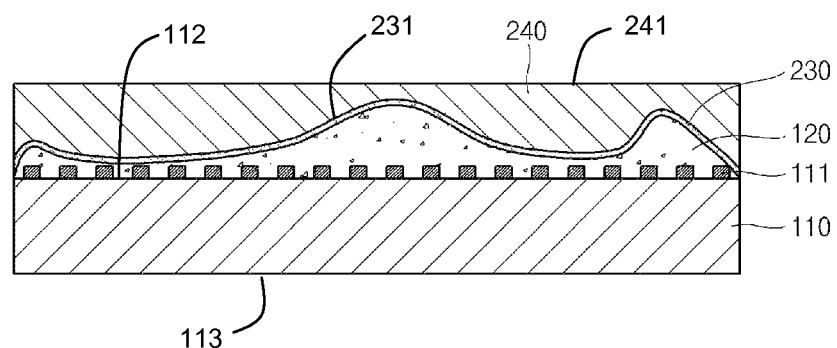

Referring to FIGS. 12 and 16, in the step molding or encapsulating the adhesive layer to form a mold layer (S4), an outer or exposed surface 231 of coating layer 230 is molded with an encapsulant material to form mold layer 240 thereon. In one embodiment, mold layer 240 can be an epoxy resin molding compound and can be formed using injection or overmolding techniques. In accordance with the present embodiment, mold layer 240 is configured to correct or reduce the thickness variation or deviation of the adhesive layer 120. In one embodiment, mold layer 240 can be formed to have a thickness greater than the thickness or thickest portion of adhesive layer 120, thereby offsetting the thickness deviation of adhesive layer 120, as generally illustrated in FIG. 16. In accordance with the present embodiment, the outer or exposed surface 241 of molding layer 240 (that is, the surface opposite to the surface contacting coating layer 230) is formed or molded to be substantially flat. Therefore, mold layer 240 can compensate for or offset the thickness deviation of adhesive layer 120. As one result, failures that may be generated at the time of fabricating the semiconductor devices can be reduced using the molding step (S4) of the present embodiment, thereby increasing the yield and improving product reliability.

Figure 17:
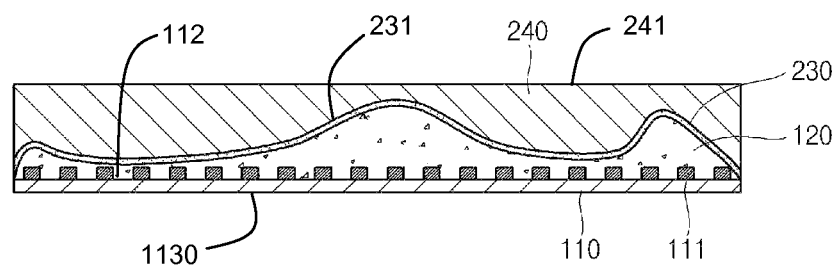

Referring to FIGS. 12 and 17, in the step of grinding the backside of wafer 110 (S4), major surface 113 of wafer 110 is exposed to a grinding or lapping process to reduce the thickness of wafer 110. The grinding step forms a new backside surface 1130 on wafer 110, as generally illustrated in FIG. 17. Adhesive layer 120, coating layer 230, and mold layer 240 protect major surface 112 of wafer 110 including conductive structures 111 from damage during the step of grinding (S5).

Figure 18:
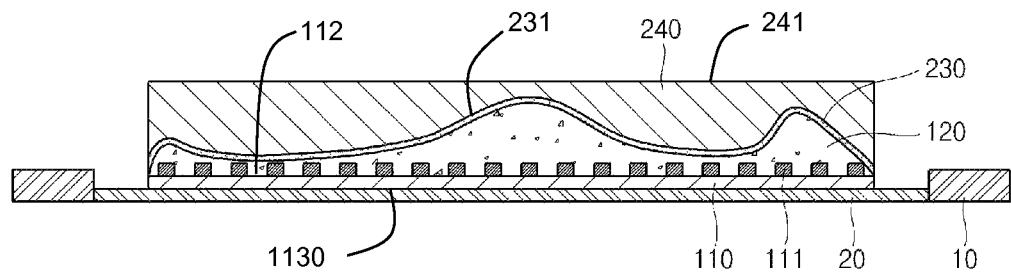

Referring to FIGS. 12 and 18, in the step of mounting of tape (S6), wafer 110 is mounted to tape 20, which has opposite sides fixed to a rigid frame 10. In the present embodiment, surface 1130 of wafer 110 is mounted to an upper surface of tape 20. Specifically, tape 20 is adhered to the bottom surface of wafer 110 opposite to a top surface of wafer 10, which has mold layer 240 formed thereon. Accordingly, because major surface 1130 of wafer 110 is fixed to tape 20, wafer 110 can be securely supported for subsequent processing.

Figure 19:
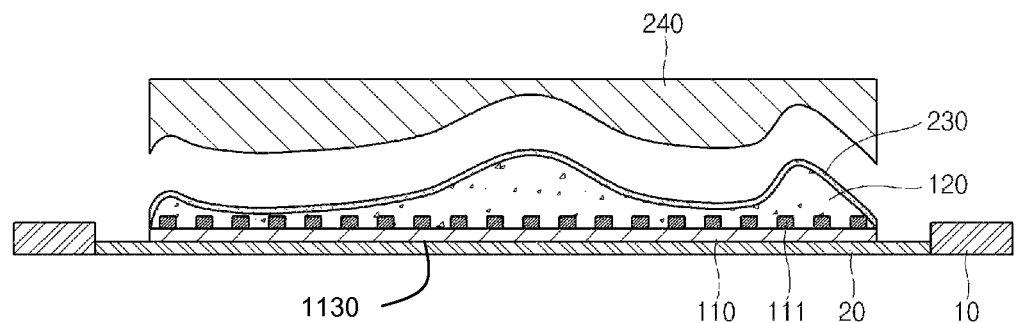

Referring to FIGS. 12 and 19, in the step of performing zone separating (S7), coating layer 230 and mold layer 240 are separated from each other. In one embodiment, the zone separating step can be achieved by using an edge zone release (EZR) process or by using an edge trimming or profiling processing. By way of example, in the EZR process, the edge zone of coating layer 230 can be softened in a solvent bath and coating layer 230 can be peeled away. In an example edge trimming process, a blade can be used to remove the edge zone of coating layer 230 to eliminate that portion of coating layer 230 that has stronger adhesive.

Figure 20:
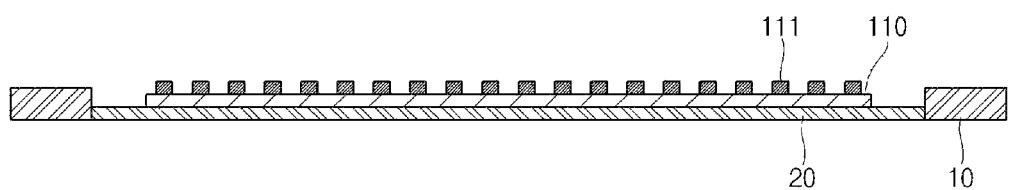

Referring to FIGS. 12 and 20, in the step of removing adhesive layer 120 (S5), adhesive layer 120 is removed from major surface 112 of wafer 110. In one embodiment, adhesive layer 120 can be removed by applying heat to the interface between wafer 110 and adhesive layer 120, and then sliding wafer 110 away from adhesive layer 120. After the removing of adhesive layer 120, major surface 112 of wafer 110 can be rinsed using, for example, a wafer spin, rinse, and dry apparatus. Wafer 110 can then be further processed. In one embodiment, a back metal layer can formed on major surface 1130. In one embodiment, wafer 110 can then be singulated into individual semiconductor devices with or without the back metal layer.

As described above in the first and second embodiments, in the third embodiment, the yield and reliability of the semiconductor devices can be improved while reducing failures in the fabrication process by correcting the thickness deviation of adhesive 120 layer using mold layer 240. This results in each individual semiconductor device having a more uniform thickness.

From all of the foregoing, one skilled in the art can determine that according to one embodiment, a method for fabricating a semiconductor device includes providing a wafer (for example, element 110) having conductive structures (for example, element 111) formed on a first major surface (for example, element 112). The method includes forming a protective layer (for example, element 120) over the first major surface and forming a mold layer (for example element 130, 240) over the protective layer.

Those skilled in the art will also appreciate that, according to another embodiment, the method can further include reducing the thickness (for example, step S4, step S5) of the wafer by removing material from a second major surface (for example, element 113) of the wafer opposite to the first major surface after forming the mold layer.

Those skilled in the art will also appreciate that, according to a further embodiment, the method can further include zone coating (for example, element 230) a top portion of the protective layer before forming the mold layer.

Those skilled in the art will also appreciate that, according to a still further embodiment, a method for forming an electronic device includes providing a substrate (for example, element 110) having a plurality of electronic devices formed adjacent a first major surface (for example, element 112) of the substrate. The method includes forming a protective layer (for example, element 120) over the first major surface, wherein the protective layer has a thickness deviation across the first major surface. The method includes forming a mold layer (for example, element 130, 240) over the protective layer, wherein the mold layer has a thickness configured to compensate for the thickness deviation and removing material from a second major surface (for example, element 113) of substrate thereby reducing its thickness.

Those skilled in the art will also appreciate that, according to a still further embodiment, a method for forming an electronic device includes providing a substrate (for example, element 110) having a plurality of electronic devices formed adjacent a first major surface (for example, element 112) of the substrate, forming a protective layer (for example, element 120) over the first major surface, wherein the protective layer has a thickness deviation across the first major surface, forming a mold layer (for example, element 130, 240) over the protective layer, wherein the mold layer has a thickness configured to compensate for the thickness deviation and removing material from a second major surface (for example, element 113) of substrate thereby reducing its thickness.

Those skilled in the art will also appreciate that, according to another embodiment, the step of forming the protective layer can include forming an adhesive layer.

Those skilled in the art will also appreciate that, according to a further embodiment, a method for reducing the thickness of a substrate comprises providing a substrate (for example, element 110) having first and second opposing major surfaces (for example, element 112, 113), forming a protective layer (for example, element 120) over the first major surface, forming a mold layer (for example, element 130, 240) over the protective layer, and reducing the thickness of the substrate by removing material from the second major surface.

Those skilled in the art will also appreciate that, according to a still further embodiment, forming the mold layer can include forming the mold layer having an outer surface (for example, element 131, 241) opposite to its surface contacting an upper surface (for example, element 121) of the protective layer, wherein the outer surface is formed to have less thickness deviation than that of the upper surface of the protective layer.

Those skilled in the art will also appreciate that, according to another embodiment, forming the protective layer can comprise forming an adhesive layer, and the method can further include forming a coating layer (for example, element 230) between the adhesive layer and the mold layer, mounting the substrate to a tape (for example, element 20) after reducing the thickness of the substrate, separating the mold layer from the coating layer, and removing the adhesive layer from the substrate.

In view of all the above, it is evident that a novel method is disclosed. Included, among other features, is providing a substrate, forming a protective layer over one surface of the substrate, forming mold layer over the protective layer, removing material from the backside surface of the substrate, and removing the mold layer and the protective layer. The mold layer is configured to compensate for the thickness variation of the protective layer thereby improving the thickness uniformity of individual devices contained the wafer. This improves the reliability of the individual devices.

While the subject matter of the invention is described with specific preferred embodiments and example embodiments, the foregoing drawings and descriptions thereof depict only typical embodiments of the subject matter and are not, therefore, to be considered limiting of its scope. It is evident that many alternatives and variations will be apparent to those skilled in the art. For example, the subject matter has been described for semiconductor devices; however, the method and structure is directly applicable to other electronic devices, such as optoelectronic devices, sensor devices, imaging devices, solar cells, medical devices, and other devices configured for and/or benefited by substrate thinning methods.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and form different embodiments, as would be understood by those skilled in the art.

What is claimed is:

1. A method of fabricating a semiconductor device comprising:
   providing a wafer having conductive structures formed on a first major surface;
   depositing a protective layer onto the first major surface, the protective layer having a thickness deviation across the first major surface including a first portion thicker than a second portion; and
   thereafter forming a mold layer on the protective layer using a molding apparatus, wherein the mold layer has an outer surface molded using the molding apparatus to be substantially flat thereby offsetting the thickness deviation of the protective layer.

2. The method of claim 1, wherein forming the mold layer comprises forming the mold layer having a thickness greater than a thickness deviation of protective layer.

3. The method of claim 1, wherein depositing the protective layer comprises spin-coating the protective layer onto the first major surface.

4. The method of claim 1, further comprising reducing the thickness of the wafer by removing material from a second major surface of the wafer opposite to the first major surface after forming the mold layer.

5. The method of claim 4, further comprising removing the protective layer by applying heat to the protective layer and sliding the wafer away from the protective layer, after reducing the thickness of the wafer.

6. The method of claim 4, further comprising:
   fixing the second major surface of the wafer to a tape after reducing the thickness of the wafer; and
   separating the mold layer from the protective layer.

7. The method of claim 6, further comprising removing the protective layer remaining on the first major surface of the wafer, after separating the mold layer.

8. The method of claim 1, further comprising zone coating a top portion of the protective layer after the protective layer is deposited onto the first major surface and before forming the mold layer.

9. The method of claim 8, wherein zone coating comprises forming a coating layer along the surface of the protective layer, and wherein the coating layer has a central zone and an edge zone, and wherein the central zone has less adhesive than the edge zone.

10. The method of claim 8, further comprising mounting a tape on a second major surface of the wafer opposite to the first major surface, after forming the mold layer.

11. The method of claim 10, further comprising zone separating to remove the mold layer from the coating layer after mounting the tape.

12. The method of claim 11, further comprising removing the protective layer by applying heat to the protective layer and sliding the wafer away from the protective layer, after zone separating the mold layer from the coating layer.

13. A method for forming an electronic device comprising:
providing a substrate having a plurality of electronic devices formed adjacent a first major surface of the substrate;
forming a protective layer over the first major surface, wherein the protective layer has a thickness deviation across the first major surface;
thereafter forming a mold layer on the protective layer using a molding apparatus, wherein the mold layer has an outer surface molded using the molding apparatus to be substantially flat thereby offsetting the thickness deviation of the protective layer; and
removing material from a second major surface of substrate thereby reducing its thickness.

14. The method of claim 13 further comprising forming a coating layer after forming the protective layer and before forming the mold layer.

15. The method of 14, wherein forming the coating layer comprises forming the coating layer by zone coating.

16. The method of claim 13, wherein forming the protective layer comprises forming an adhesive layer, and wherein forming the mold layer comprises one of injection molding or overmolding.

17. A method for reducing the thickness of a substrate comprising providing a substrate having first and second opposing major surfaces;
forming a protective layer over the first major surface, wherein the protective layer has a thickness deviation across the first major surface;
thereafter forming a mold layer on the protective layer using a molding apparatus, wherein the mold layer has an outer surface molded using the molding apparatus to be substantially flat thereby offsetting the thickness deviation of the protective layer; and
reducing the thickness of the substrate by removing material from the second major surface.

18. The method of claim 17, wherein forming the protective layer comprises spin coating the protective layer onto the first major surface.

19. The method of claim 17, wherein forming the protective layer comprises forming an adhesive layer, the method further comprising:
forming coating layer between the adhesive layer and the mold layer;
mounting the substrate to a tape after reducing the thickness of the substrate;
separating the mold layer from the coating layer; and
removing the adhesive layer from the substrate.

20. The method of claim 17 further comprising removing the protective layer by applying heat to the protective layer and sliding the substrate away from the protective layer.

* * * * *